United States Patent
Yan et al.

(10) Patent No.: US 9,077,311 B2
(45) Date of Patent: Jul. 7, 2015

(54) ACOUSTIC FILTER AND METHOD OF ACOUSTIC FILTER MANUFACTURE

(75) Inventors: Dong Yan, Nepean (CA); Tuoxin Wang, Kanata (CA)

(73) Assignee: Futurewei Technologies, Inc., Plano, TX (US)

( * ) Notice: Subject to any disclaimer, the term of this patent is extended or adjusted under 35 U.S.C. 154(b) by 666 days.

(21) Appl. No.: 13/340,396

(22) Filed: Dec. 29, 2011

(65) Prior Publication Data

US 2013/0170405 A1    Jul. 4, 2013

(51) Int. Cl.
*H03H 9/70* (2006.01)
*H03H 9/02* (2006.01)
*H03H 9/54* (2006.01)
*H03H 9/64* (2006.01)

(52) U.S. Cl.
CPC .......... *H03H 9/706* (2013.01); *Y10T 29/49016* (2015.01); *H03H 9/02023* (2013.01); *H03H 9/02551* (2013.01); *H03H 9/02015* (2013.01); *H03H 9/02543* (2013.01); *H03H 9/542* (2013.01); *H03H 9/6483* (2013.01)

(58) Field of Classification Search
CPC ... H03H 9/706; H03H 9/725; H03H 9/02023; H03H 9/02551; H03H 9/02015; H03H 9/02543; H03H 9/542; H03H 9/6483; Y10T 29/49016
USPC ......... 333/133, 193, 194, 195, 196, 186, 187, 333/188; 310/360
See application file for complete search history.

(56) References Cited

U.S. PATENT DOCUMENTS

| | | | | |
|---|---|---|---|---|
| 5,202,652 A * | 4/1993 | Tabuchi et al. | ................ | 333/193 |
| 5,854,579 A | 12/1998 | Penunuri | | |
| 5,917,387 A * | 6/1999 | Rice et al. | ...................... | 333/174 |
| 5,952,899 A * | 9/1999 | Kadota et al. | ................. | 333/193 |
| 6,424,238 B1 * | 7/2002 | Penunuri | ...................... | 333/187 |
| 6,754,471 B1 | 6/2004 | Vakilian | | |
| 7,061,345 B2 * | 6/2006 | Misu et al. | ..................... | 333/187 |
| 7,170,314 B2 * | 1/2007 | Haba et al. | ...................... | 326/30 |
| 7,378,922 B2 * | 5/2008 | Kubo et al. | ................... | 333/189 |
| 7,459,992 B2 * | 12/2008 | Matsuda et al. | ............... | 333/133 |

(Continued)

FOREIGN PATENT DOCUMENTS

| | | |
|---|---|---|
| CN | 101079611 A | 11/2007 |
| CN | 102006029 A | 4/2011 |
| EP | 0337703 A2 | 10/1989 |

OTHER PUBLICATIONS

Hoummady, M., et al., "Acoustic wave sensors: design, sensing mechanisms and applications," Smart Material Structure, 1997, vol. 6, pp. 647-657.

(Continued)

*Primary Examiner* — Benny Lee
*Assistant Examiner* — Jorge Salazar, Jr.
(74) *Attorney, Agent, or Firm* — Slater & Matsil, LLP

(57) ABSTRACT

An acoustic filter and method of acoustic filter manufacture provides a plurality of series acoustic resonators coupled in series on a first resonator substrate, a plurality of shunt resonators on a second resonator substrate, and a support substrate. The first and second resonator substrates are mounted on the support substrate. The filter further provides a plurality of electrical connections, wherein each respective electrical connection electrically couples a respective one of the plurality of shunt resonators to a respective one of the plurality of series acoustic resonators.

25 Claims, 9 Drawing Sheets

(56) References Cited

U.S. PATENT DOCUMENTS

| | | |
|---|---|---|
| 7,629,863 B2 | 12/2009 | Iwamoto et al. |
| 2002/0109564 A1* | 8/2002 | Tsai et al. .................... 333/187 |
| 2007/0290769 A1 | 12/2007 | Stuebing et al. |
| 2009/0289741 A1* | 11/2009 | Ito ................................ 333/133 |

OTHER PUBLICATIONS

International Search Report and Written Opinion received in Patent Cooperation Treaty Application No. PCT/CN2012/087986, Apr. 4, 2013, 8 pages.

* cited by examiner

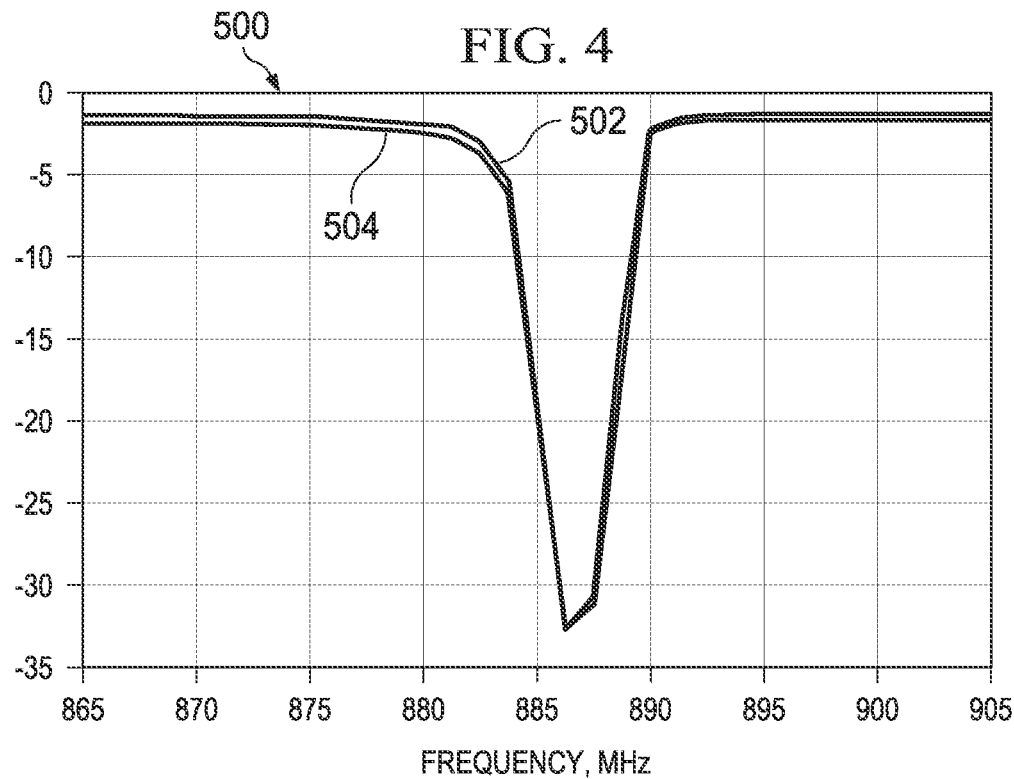
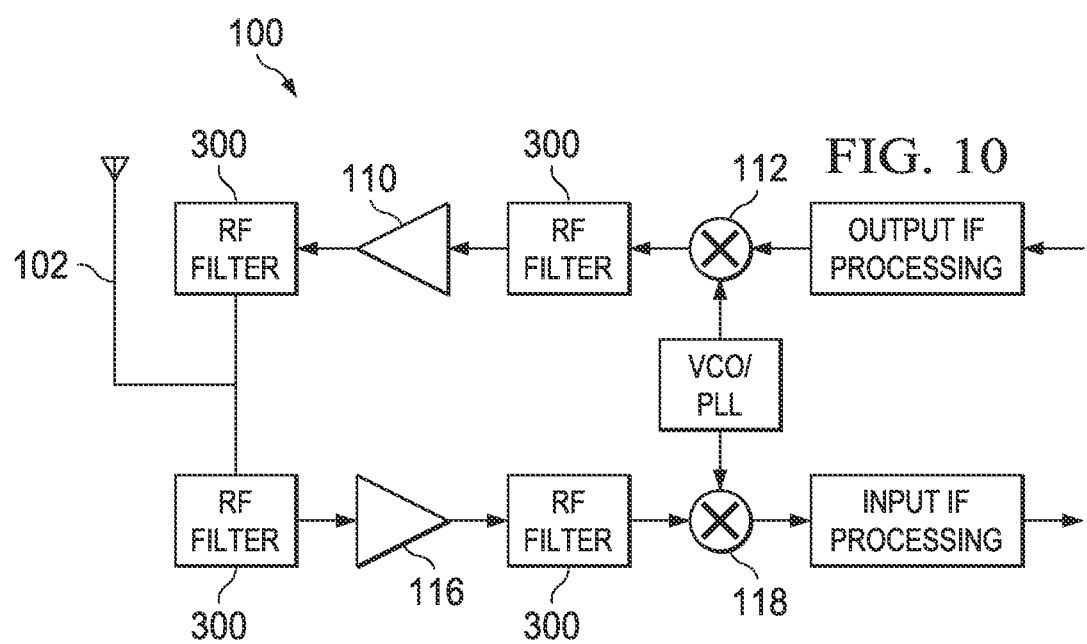

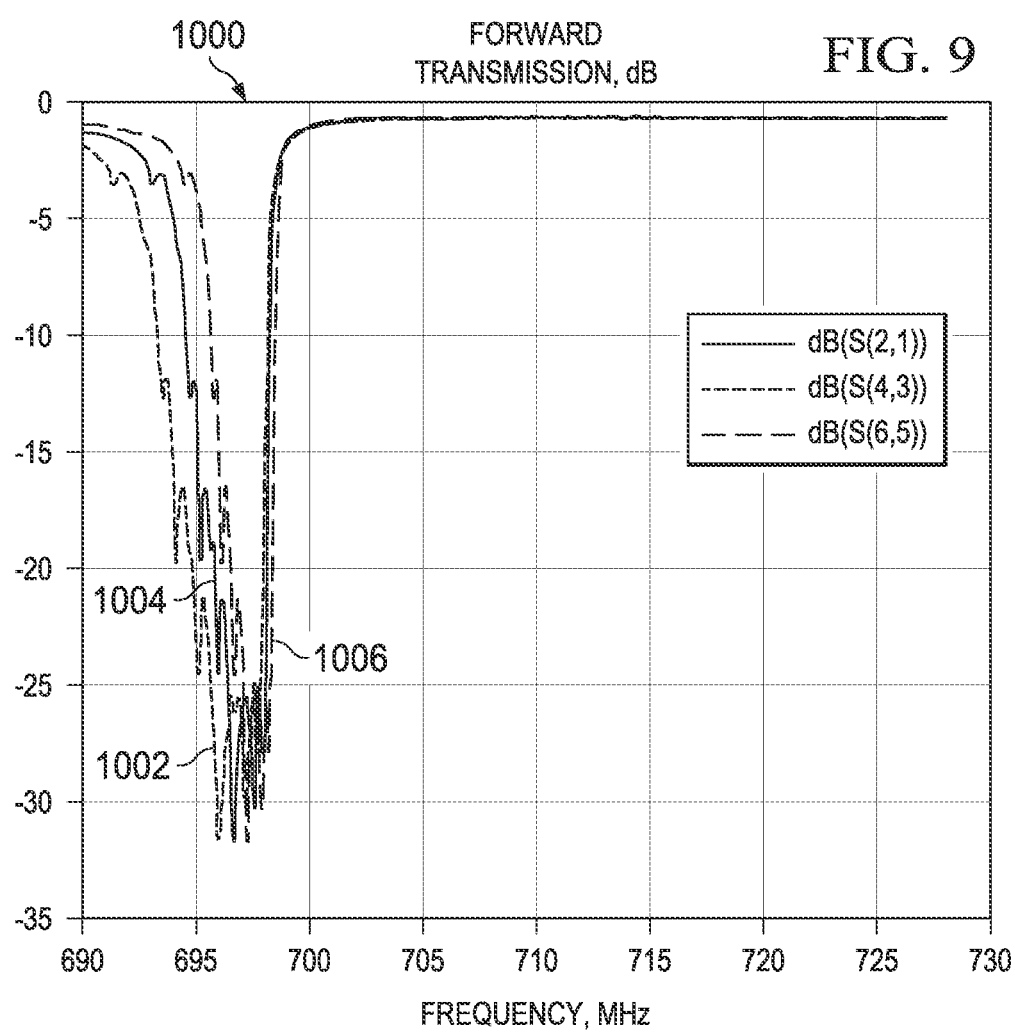

ACOUSTIC FILTER AND METHOD OF ACOUSTIC FILTER MANUFACTURE

TECHNICAL FIELD

The present invention relates generally to an acoustic wave device and method, and more particularly to an acoustic filter device and method.

BACKGROUND

Generally, the increasing use wireless communication systems has led to more dense utilization of the wireless spectrum, bringing adjacently-used frequency bands closer together. The use of pass-band filters is not ideal, as such filters may not be capable of filtering-out interference in the adjacent frequency bands. Moreover, receivers can suffer various interferences from internal and external transmit signal leakage, and these interferences can adversely affect duplexers or receiving filters.

Acoustic wave filters, such as surface acoustic wave (SAW) filters or bulk acoustic wave (BAW) filters, can be used to filter out interference, such as between frequency bands. An acoustic wave filter circuit generally includes multiple acoustic wave resonators, which convert electrical signals into acoustic waves, and vice versa. A SAW resonator typically includes a piezoelectric crystal or ceramic material with input and output interdigital transducers (IDTs) formed in a thin film metal on the piezoelectric material, where the acoustic wave propagates on the surface of the piezoelectric material. A BAW resonator typically includes a piezoelectric material with two electrodes formed on either side of the substrate, where the acoustic wave propagates through the bulk of the piezoelectric material. Piezoelectric materials include, for example, aluminum nitride, zinc oxide, quartz, lithium niobate, lithium tantalate, lanthanum gallium silicate, lead zirconate titanate. Various piezoelectric materials, such as quartz, may be manufactured with a selected cut angle, such as AT-cut, ST-cut, Y-cut, and rotated Y-cut, each of which provides different operating characteristics for the resonator.

Acoustic wave devices may be fabricated, for example, with standard integrated circuit technology. A bulk piezoelectric material may be used as the substrate. Alternatively, insulating silicon, or a silicon dioxide layer over silicon semiconductor, may be used as the substrate. If silicon is used, a piezoelectric material layer, such as zinc oxide, is formed on the substrate. The IDTs may be formed on or under the piezoelectric layer using, for example, an integrated circuit etching or lift-off process. In the etching process, a metal layer is formed on the device, and photolithography is used to positively pattern the IDTs and remove the unwanted metal from the device. In the lift-off process, photolithography is used to negatively pattern the IDTs, a metal layer is deposited, and the unwanted metal is lifted-off of the device.

The foregoing structures and fabrication processes are disadvantageous, as they fail to attain the requisite filtering performance called for in contemporary wireless networks, particularly given the increasingly dense use of adjacent frequency bands. Moreover, the known filter structures are not scaled desirably for contemporary networks.

SUMMARY OF THE INVENTION

An embodiment acoustic filter provides a plurality of series acoustic resonators coupled in series on a first resonator substrate, a plurality of shunt resonators on a second resonator substrate, and a support substrate. The first and second resonator substrates are mounted on the support substrate. The filter further provides a plurality of electrical connections, wherein each respective electrical connection electrically couples a respective one of the plurality of shunt resonators to a respective one of the plurality of series acoustic resonators.

An embodiment method of fabricating an acoustic filter provides for forming a plurality of series acoustic resonators coupled in series on a first resonator substrate, and a plurality of shunt resonators on a second resonator substrate. The first and second resonator substrates are mounted on a support substrate, and are electrically coupled to each of the plurality of shunt resonators to a respective one of the plurality of series acoustic resonators.

An embodiment wireless communication device comprises an antenna, an antenna duplexer coupled to an antenna, a mixer, and an input amplifier and an acoustic filter coupled between the antenna duplexer and the mixer, wherein the acoustic filter comprises a first resonator substrate comprising a plurality of series acoustic resonators, and a second resonator substrate comprising a plurality of shunt resonators, wherein each of the plurality of shunt resonators is electrically coupled to a respective one of the plurality of series acoustic resonators.

Advantages of one or more of the disclosed embodiments include a reduction or elimination of interference from adjacent frequency bands, as well as a reduction in size and/or cost of wireless equipment, such as a base-station or user equipment, and their components.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 is a graph comparing filter performance;

FIG. 9 is a graph comparing filter performance; and

FIG. 10 is a block diagram of a wireless communications device including acoustic wave filters in accordance with an embodiment of the invention.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described primarily with respect to embodiments in a specific context, namely a surface acoustic wave resonators in a stop-band filter used in a radio frequency (RF) front end of a wireless base-station. The invention may also be applied, however, to other types of acoustic devices, such as bulk acoustic wave resonators and the like, as well as to other types of devices and filters, such as antenna duplexers, intermediate frequency (IF) filters, delay lines, and the like. The invention may be applied in many types of wireless or cellular systems, such as UMTS, WCDMA, cdma2000, IEEE 802.16, WiMAX, GSM, 3GPP LTE, LTE-A, and the like, as well as systems that provide for a combination of two or more of these technologies.

In a frequency division duplexing (FDD) system, the possibility of out-band interference and transmit signal leakage generally poses higher requirements on the out-band suppression of the duplexer or receiving filter. Increasing out-band suppression, however, can increase in-band insertion loss, as well as the size and cost of components. When the out-band suppression of the duplexer or the filter is not high enough, the interference can affect the linearity of the receiver. For example, in a FDD device, insufficient duplexer isolation can result in transmit signal leakage into the receiver.

Figure 1:
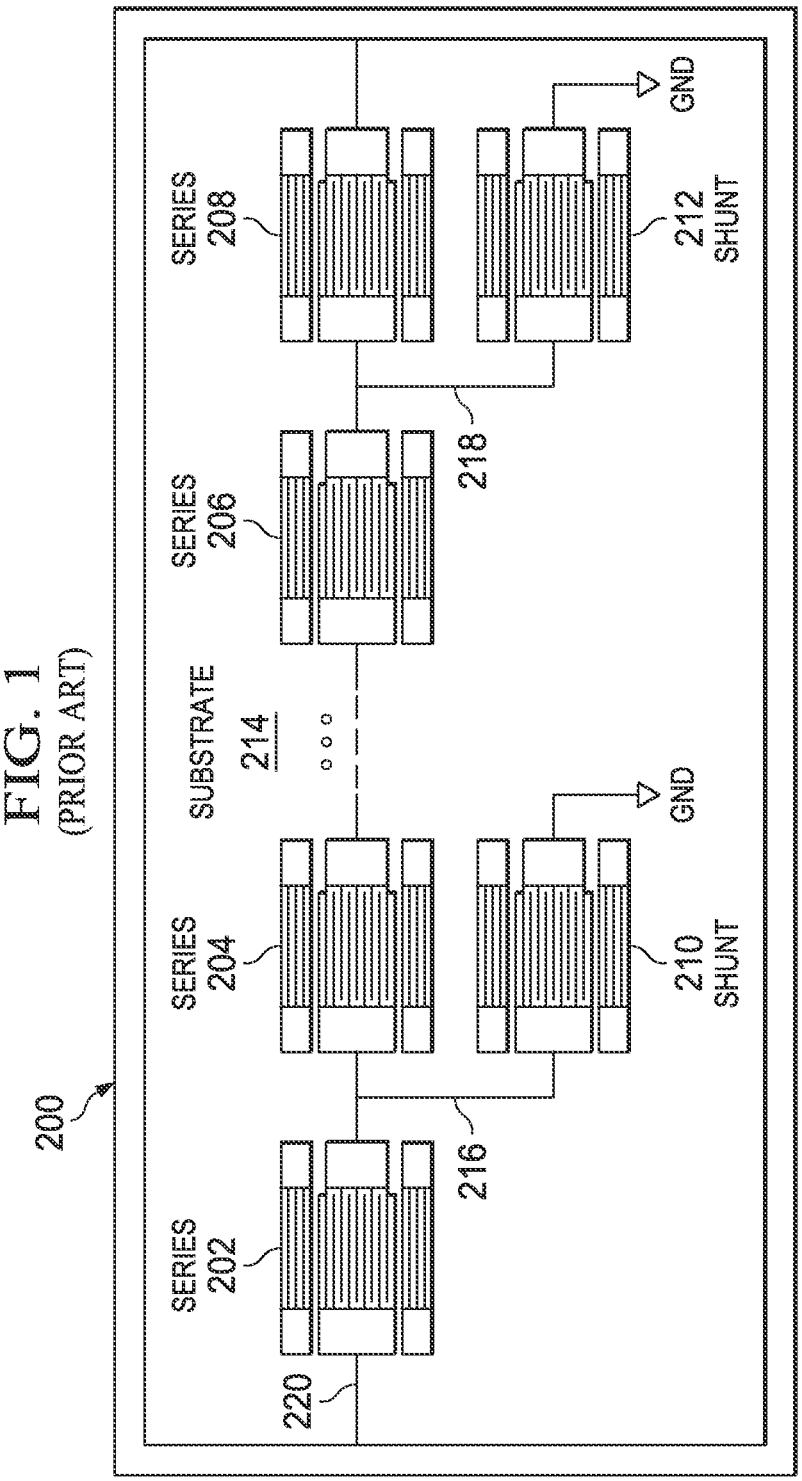
FIG. 1 illustrates a prior art ladder type SAW filter.

FIG. 1 illustrates a prior art ladder-type saw filter 200. Saw resonators 202, 204, 206, 208 are connected in series in the main signal path 220. Shunt resonators 210, 212 are connected between main signal path and ground. The series-shunt combinations act as inductance-capacitance-resistance (LCR) impedance elements. There may be many such series-shunt elements in a single ladder-type saw filter. All of the resonators are manufactured on the same substrate 214. Generally, such a traditional ladder-type saw filter suffers extra insertion loss due to the long metal connections 216, 218 between the main signal path 220 and shunt resonators 210, 212. Being formed on a single substrate, all of the resonators in the device are based on the same resonating mechanism, in this case surface acoustic wave. Alternatively, all of the resonators are based on another resonating mechanism, such as bulk acoustic wave. In any event, such devices are not formed as mixed resonator structures (i.e., SAW and BAW filters). In an effort to reduce signal loss, different metals and metal alloys, such as copper and copper/aluminum alloy, have been used to replace aluminum as the connection material.

Figure 2:
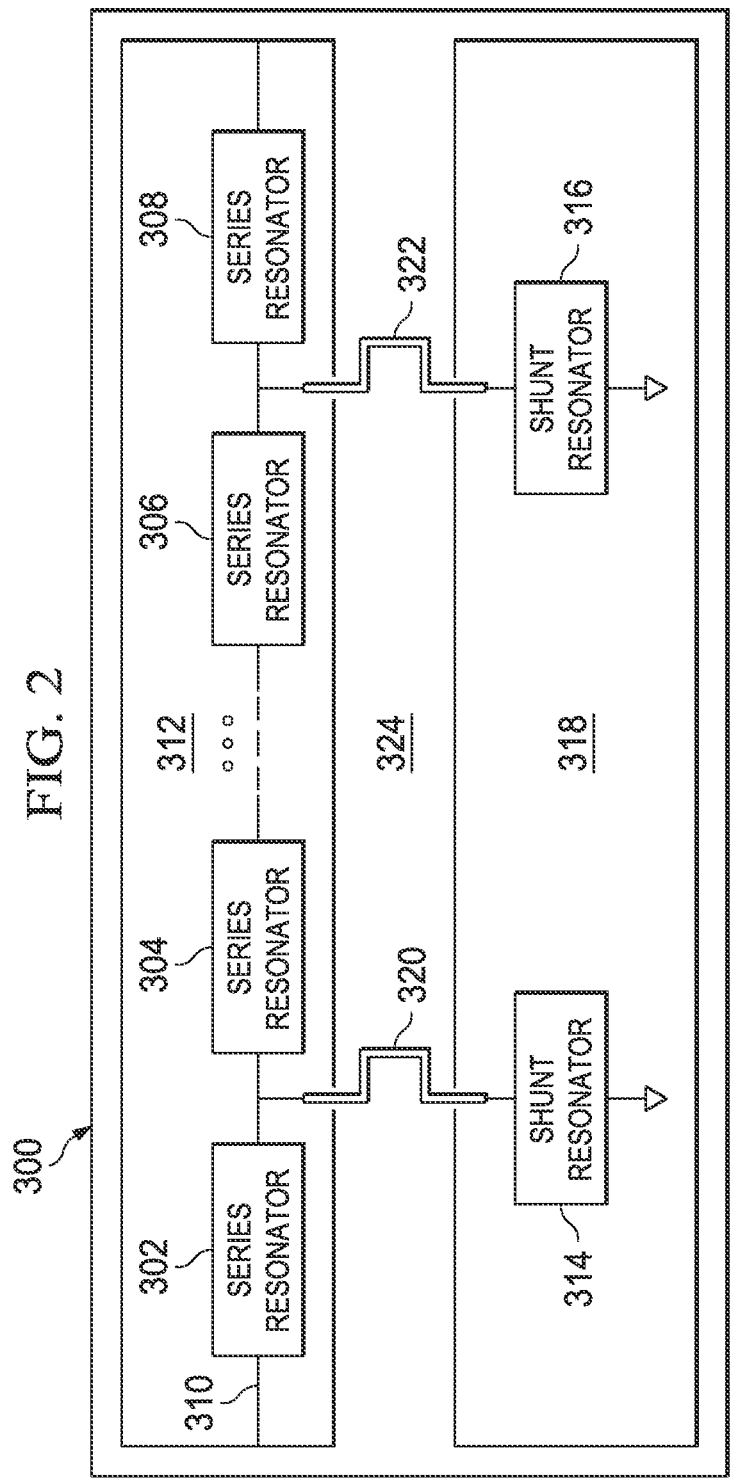
FIG. 2 illustrates an acoustic wave filter in accordance with an embodiment of the invention.

FIG. 2 illustrates an embodiment of a novel acoustic filter having a series of resonators and shunt resonators fabricated on different substrates. Additionally or alternatively, the series and shunt resonators can be fabricated using different materials. Utilizing different substrates and/or materials allows the performance of each type of resonator to be optimized individually to improve overall filter performance. Individual optimization provides fewer constraints and greater freedom of design for each resonator or type of resonator because the other resonators or types of resonators generally do not need to be taken into account.

Generally, RF filter miniaturization is an integral part of wireless base station size and performance. The disclosed embodiments enable a reduction in size of a wireless device's RF front end filters while improving filter performance.

Embodiments of the invention are applicable to a wide frequency range, for example up to 3 GHz, and therefore have world wide application. For example, if an implementation currently uses an external filter attached to a main base station, an embodiment allows the external filter to be removed without scarifying system performance. Further, by fabricating series and shunt resonators on different substrates, shorter circuit routing can be implemented, resulting in smaller die size, less printed circuit board (PCB) area, and the like.

In FIG. 2, acoustic filter 300 includes series resonators 302, 304, 306, 308 in series in the main signal path 310. The series resonators are fabricated on a first resonator substrate 312. Shunt resonators 314, 316 are connected between the main signal path 310 and ground. The shunt resonators are fabricated on a separate, second resonator substrate 318. Alternatively, each of the first and second substrates may include multiple individual substrates. Because the series and shunt resonators are fabricated on separate substrates, the series and shunt resonators may be fabricated as different types of resonators, such as the series resonators being SAW resonators and the shunt resonators being BAW resonators. With the separate substrates, each type of resonator, series and shunt, may be optimized for its specific application. Furthermore, the two substrates may be placed close together such that the metal connections 320, 322 between the shunt resonators and the main signal path may be made shorter than the case where all of the resonators are manufactured on a single substrate, thereby reducing insertion loss.

The two resonator substrates may be disposed adjacent to each other on a support substrate 324, for example, in a ceramic package or functioning as a printed circuit board or motherboard. The support substrate 324 may be formed from a ceramic material, an insulating laminate such as Bismaleimide Triazine (BT), or another electrical insulating material.

Connections 320, 322 between the substrates may be wire bonds connecting contact pads for the shunt resonators on the second resonator substrate to contact pads for the main signal path on the first resonator substrate. Alternatively, the connections may include vias in the resonator substrates, solder ball connections to contact pads on the support substrate, and traces on the support substrate connecting the contact pads. In another embodiment, the resonator substrates may be stacked, and the connections made, for example, with through-substrate vias (TSVs) and respective contact pads. In another embodiment, the resonator substrates may be connected in a face-up tape automated bonding (TAB) type arrangement with the connections between the substrates being made by lead frame fingers to conductive pads on the substrates. A further embodiment provides a structure in which the resonator substrates may be connected in a face-down flip-chip type arrangement with the connections between the substrates being made by solder balls or conductive bumps. In a stacked or flip-chip arrangement, a gap between substrates may be provided to allow for propagation of the acoustic wave, such as the surface acoustic wave in a SAW resonator.

In an embodiment, the two resonator substrates may be mounted on a support substrate in an acoustic filter package. Alternatively, the two resonator substrates may be mounted on a support substrate by solder or other mechanical methods along with other circuitry substrates as a multi-chip module. As another alternative, the two resonator substrates may be mounted on a support substrate functioning as a motherboard for other circuitry in the device. Connection materials for the various types of electrical connections described above include solder, tin, lead, silver, copper, aluminum, gold, nickel, alloys thereof, combinations thereof, and other conductive materials (and alloys and combinations with the foregoing metals).

Figure 3:
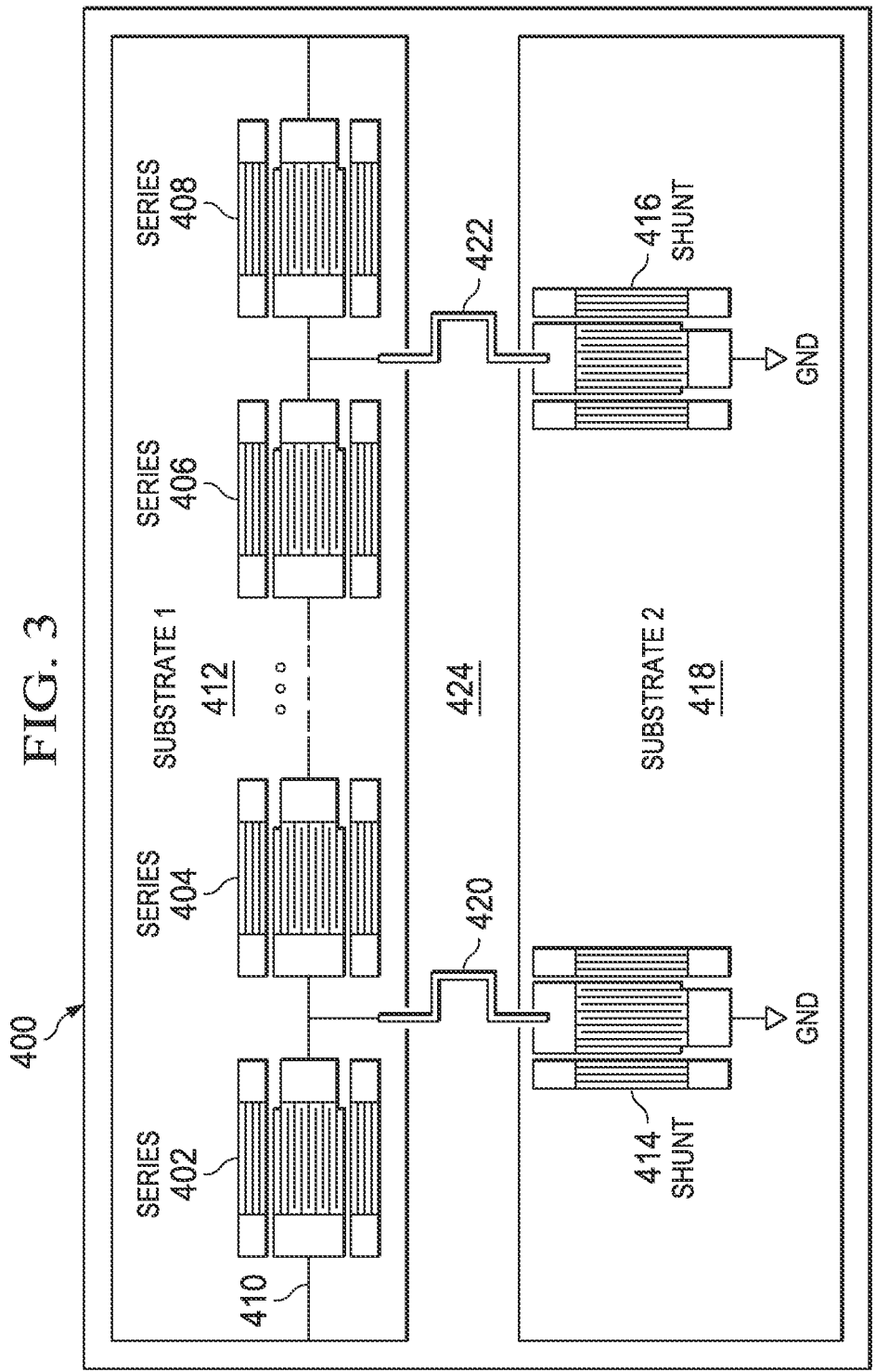
FIG. 3 illustrates series SAW resonators with SAW shunt resonators in accordance with an embodiment of the invention.

In an embodiment, the series resonators and shunt resonators in a filter are fabricated on different substrates. FIG. 3 illustrates separate substrates with the same type of resonators (in this case, SAW resonators), used for both the series resonators and the shunt resonators. In FIG. 3, acoustic filter 400 includes series SAW resonators 402, 404, 406, 408 in series in the main signal path 410. The series SAW resonators are fabricated on a first resonator substrate 412. Shunt SAW resonators 414, 416 are connected between the main signal path 410 and ground. The shunt SAW resonators are fabricated on a different, second resonator substrate 418. Alternatively, the series resonators and the shunt resonators may be BAW resonators. Metal connections 420, 422 between the two substrates connect the shunt resonators to the main signal path. The two resonator substrates are disposed next to each other on a support substrate 424, for example, in a ceramic package or functioning as a printed circuit board or motherboard.

FIG. 4 is a graph 500 comparing stop-band filter performance of traditional SAW filter 200 of FIG. 1 with the SAW filter 400 embodiment of FIG. 3. As can be seen in the graph, the frequency response of SAW filter 400 (curve 502) is improved compared to the frequency response of SAW filter 200 (curve 504). Frequency response curve 502 for the SAW filter 400 has improved pass-band and stop-band characteristics versus the frequency response curve 504 for SAW filter 200.

In various embodiments, different resonating mechanisms may be used for different resonators based on their individual application requirements. For example, the series and/or shunt resonators can be surface acoustic wave resonators, bulk acoustic wave resonators, lumped element resonators, dielectric resonators, and the like. Furthermore, the series resonators may be fabricated on multiple substrates, and the shunt resonators may be fabricated on multiple substrates. Any of the different types of resonators may be used for any individual series or shunt resonator, and each type of resonator may be used in combination with any of the same of different types of resonators in a filter.

Figure 5:
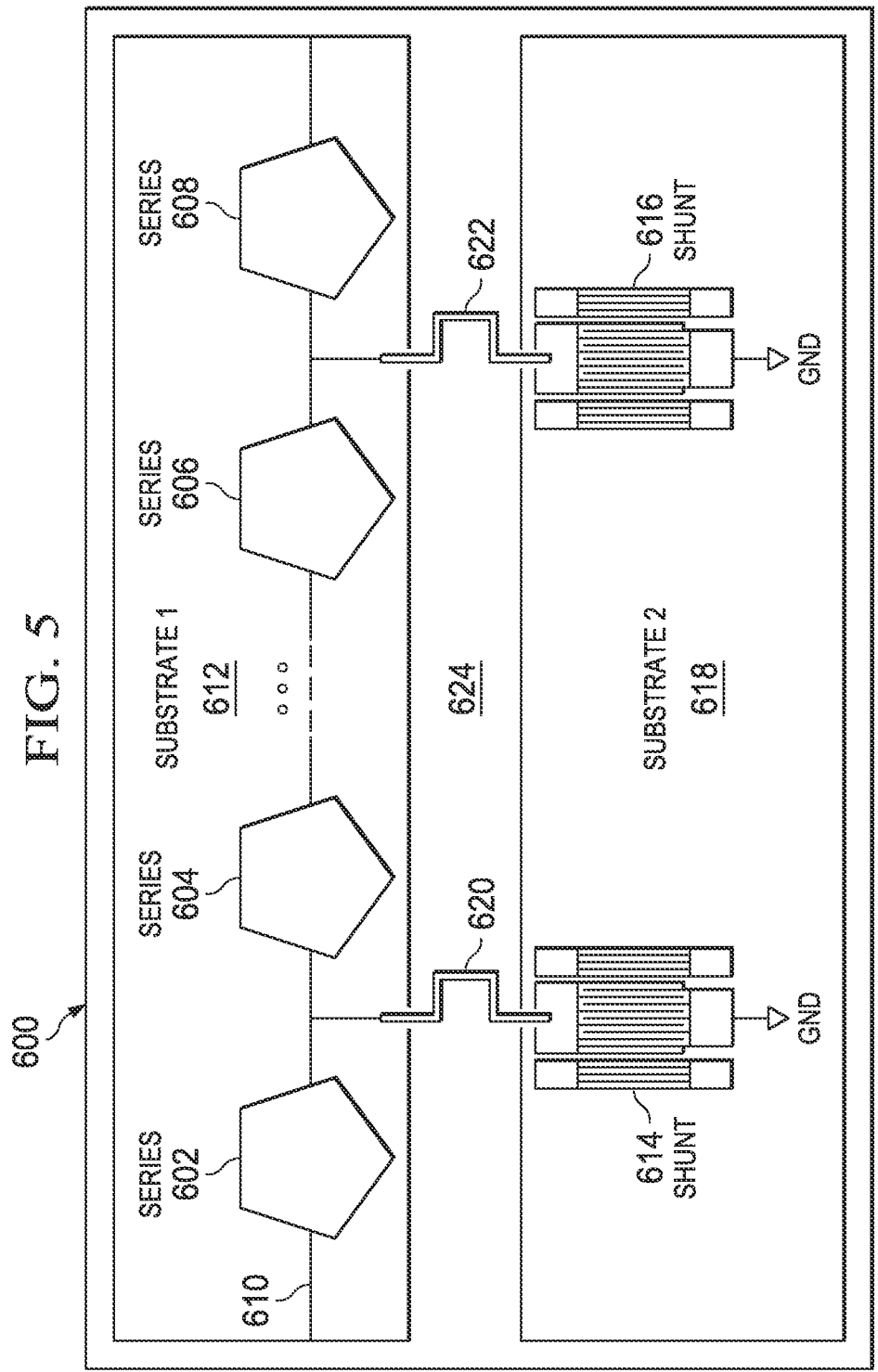
FIG. 5 illustrates series BAW resonators with shunt SAW resonators in accordance with an embodiment of the invention.

FIG. 5 illustrates an embodiment utilizing series BAW resonators with shunt SAW resonators fabricated on different substrates. In FIG. 5, acoustic filter 600 includes series BAW resonators 602, 604, 606, 608 in series in the main signal path 610. The series BAW resonators are fabricated on a first resonator substrate 612. Shunt SAW resonators 614, 616 are connected between the main signal path 610 and ground. The shunt SAW resonators are fabricated on a separate, second resonator substrate 618. Metal connections 620, 622 between the two substrates connect the shunt resonators to the main signal path. The two resonator substrates are disposed next to each other on a support substrate 624, for example, in a ceramic package or functioning as a printed circuit board or motherboard.

Figure 6:
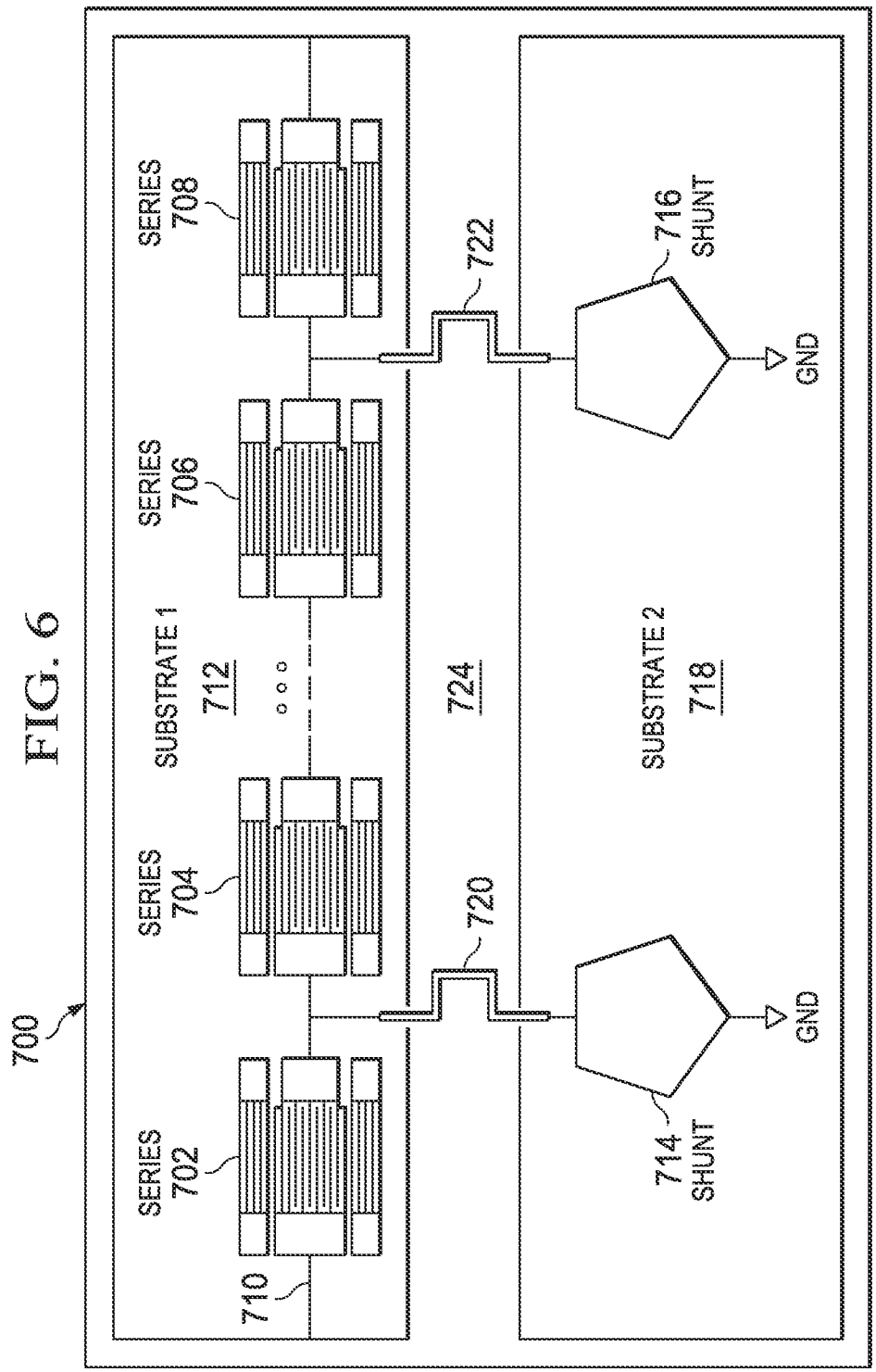
FIG. 6 illustrates series SAW resonators with shunt BAW resonators in accordance with an embodiment of the invention.

FIG. 6 illustrates an embodiment utilizing series SAW resonators with shunt BAW resonators fabricated on different substrates. In FIG. 6, acoustic filter 700 includes series SAW resonators 702, 704, 706, 708 in series in the main signal path 710. The series SAW resonators are fabricated on a first resonator substrate 712. Shunt BAW resonators 714, 716 are connected between the main signal path 710 and ground. The shunt BAW resonators are fabricated on a different, second resonator substrate 718. Metal connections 720, 722 between the two substrates connect the shunt resonators to the main signal path. The two resonator substrates are disposed next to each other on a support substrate 724, for example, in a ceramic package or functioning as a printed circuit board or motherboard.

Figure 7:
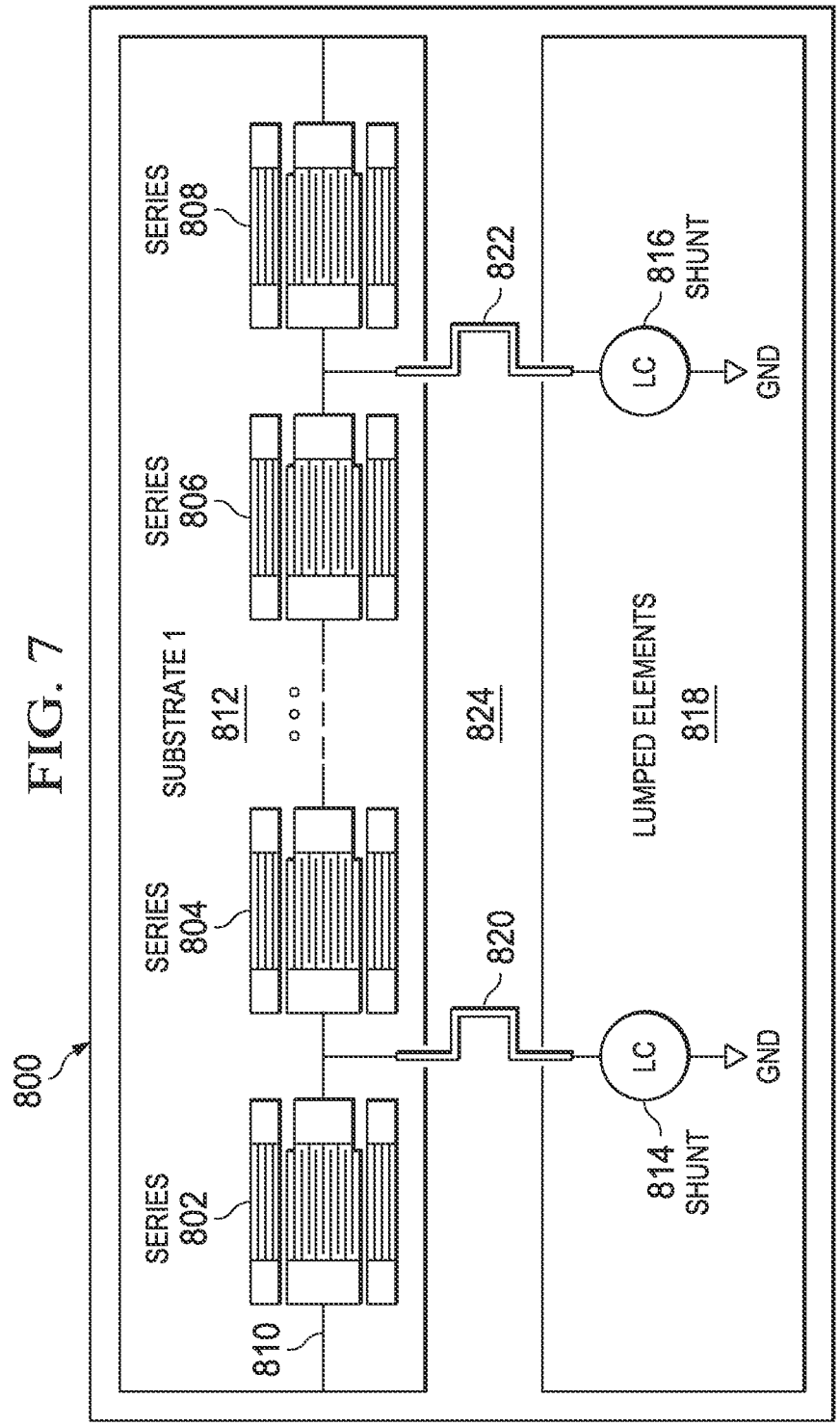
FIG. 7 illustrates series SAW resonators with shunt LC resonators in accordance with an embodiment of the invention.

FIG. 7 illustrates an embodiment utilizing series SAW resonators with shunt LC resonators fabricated on different substrates. In FIG. 7, acoustic filter 800 includes series SAW resonators 802, 804, 806, 808 in series in the main signal path 810. The series SAW resonators are fabricated on a first resonator substrate 812. Shunt LC resonators 814, 816 are connected between the main signal path 810 and ground. The shunt LC resonators are fabricated on a different, second resonator substrate 818. Alternatively, the series resonators may be BAW resonators. Metal connections 820, 822 between the two substrates connect the shunt resonators to the main signal path. The two resonator substrates are disposed next to each other on a support substrate 824, for example, in a ceramic package or functioning as a printed circuit board or motherboard.

Figure 8:
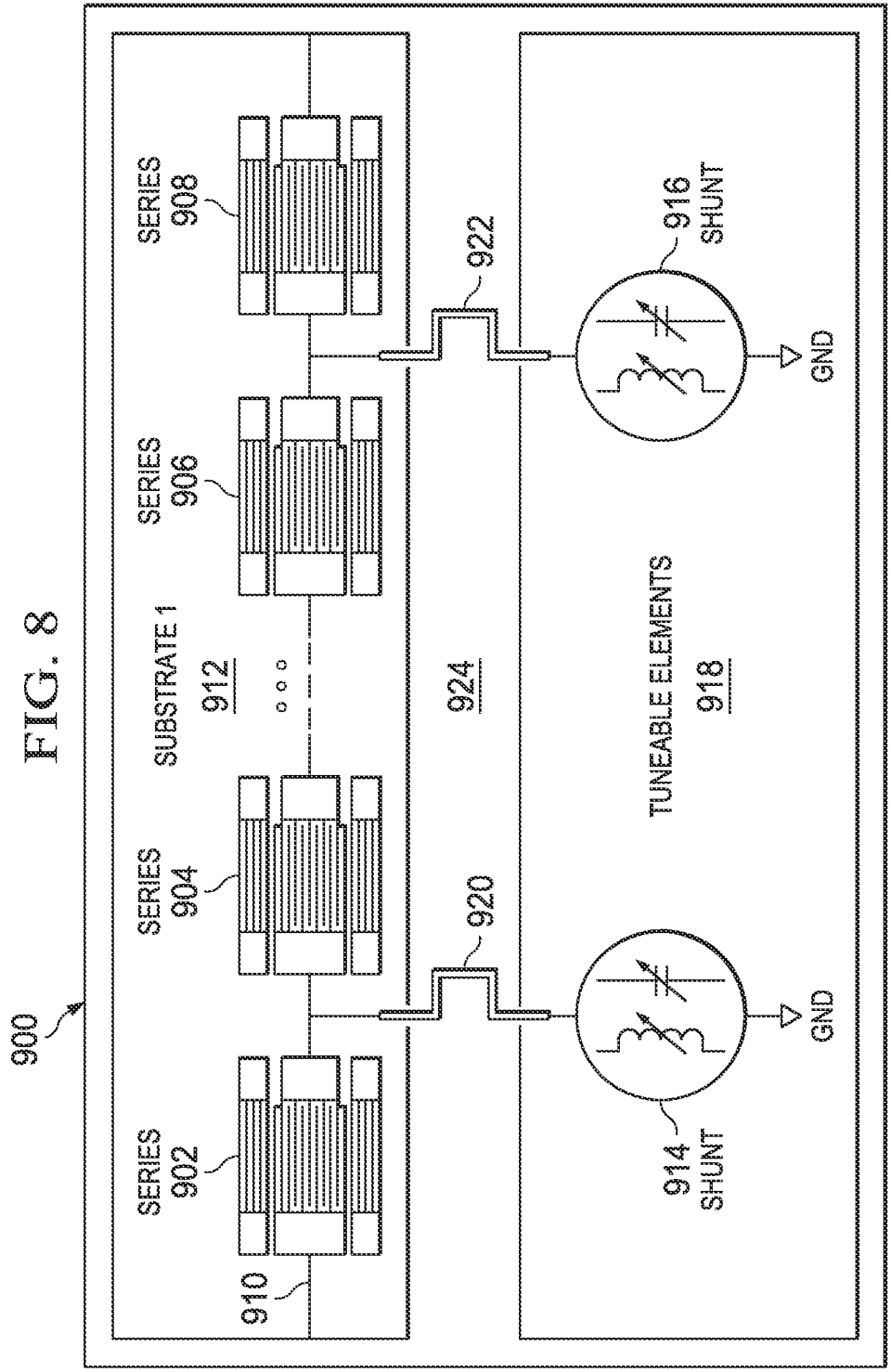
FIG. 8 illustrates series SAW resonators with tunable shunt resonators in accordance with an embodiment of the invention.

The series and/or shunt resonator can also be realized using piezoelectric material or varactors, so their resonance frequency is tunable. A filter fabricated with such resonators has a tunable bandwidth and/or center frequency. FIG. 8 illustrates an embodiment utilizing series SAW resonators with shunt tunable resonators fabricated on different substrates. In FIG. 8, acoustic filter 900 includes series SAW resonators 902, 904, 906, 908 in series in the main signal path 910. The series SAW resonators are fabricated on a first resonator substrate 912. Shunt tunable resonators 914, 916 are connected between the main signal path 910 and ground. The shunt tunable resonators are fabricated on a different, second resonator substrate 918. Alternatively, the series resonators may be BAW resonators. Metal connections 920, 922 between the two substrates connect the shunt resonators to the main signal path. The two resonator substrates are disposed next to each other on a support substrate 924, for example, in a ceramic package or functioning as a printed circuit board or motherboard.

FIG. 9 is a graph 1000 comparing filter performance. When shunt resonators 914, 916 in FIG. 8 are tuned to different resonant frequencies, acoustic filter 900 can have different performance curves 1002, 1004, 1006.

FIG. 10 illustrates a block diagram of a wireless communications device 100, such as a wireless or cellular base station, which includes one or more acoustic wave RF filters in accordance with an embodiment of the invention. In various embodiments, one or more of the RF filters used in device 100 are implemented as acoustic filters 300. Any of the embodiment acoustic filters disclosed herein may be used for any of the RF filters 300 in device 100. In FIG. 10, antenna 102 is connected to a front-end duplexer including acoustic wave RF filter 300 in the transmit circuit and RF filter 300 in the receive circuit. Another acoustic wave RF filter 300 is positioned in the transmit path between mixer 112 and power amplifier 110. A fourth acoustic wave RF filter 300 is positioned in the receive path between low noise amplifier 116 and mixer 118. The order of various components depicted in this drawing may be different in other embodiments. For example, the low noise amplifier 116 and the RF filter 114 may be reversed. Other circuitry that is included in a wireless communications device is omitted for clarity. As an example of filter operation, acoustic wave filter 300 between amplifier 116 and mixer 118 filters out the transmitter leakage that may have leaked into the receive chain. By reducing leakage from the transmitter, the linearity requirements of the associated receive circuit may be reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An acoustic filter comprising:
    a plurality of series acoustic resonators coupled in series on a first resonator substrate;
    a plurality of shunt resonators on a second resonator substrate, wherein one of the first and second resonator substrates is quartz with a first cut angle, and the other of the first and second resonator substrates is quartz with a second cut angle;
    a support substrate, wherein the first and second resonator substrates are mounted on the support substrate; and
    a plurality of electrical connections, wherein each respective electrical connection electrically couples a respective one of the plurality of shunt resonators to a respective one of the plurality of series acoustic resonators.

2. The acoustic filter of claim 1, wherein the plurality of series acoustic resonators are surface acoustic wave resonators.

3. The acoustic filter of claim 1, wherein the plurality of series acoustic resonators are bulk acoustic wave resonators.

4. The acoustic filter of claim 1, wherein the plurality of shunt resonators are surface acoustic wave resonators.

5. The acoustic filter of claim 1, wherein the plurality of shunt resonators are bulk acoustic wave resonators.

6. The acoustic filter of claim 1, wherein the plurality of shunt resonators are inductor-capacitor (LC) wave resonators.

7. The acoustic filter of claim 1, wherein the support substrate is formed from at least one of a ceramic material or an insulating laminate.

8. The acoustic filter of claim 1, wherein the series acoustic resonators and shunt resonators are at least partially formed from different materials from each other.

9. The acoustic filter of claim 1, wherein the first and second cut angles are each selected from the group consisting of: AT-cut, ST-cut, Y-cut, and rotated Y-cut.

10. The acoustic filter of claim 1, wherein the support substrate is a printed circuit board.

11. The acoustic filter of claim 1, wherein each of the plurality of electrical connections comprises a wirebond connection.

12. The acoustic filter of claim 1, wherein each of the plurality of electrical connections comprises a solder ball connection.

13. The acoustic filter of claim 1, wherein the plurality of shunt resonators are tunable resonators.

14. The acoustic filter of claim 13, wherein the tunable resonators each comprise a varactor.

15. The acoustic filter of claim 14, wherein the tunable resonators each further comprise a tunable inductor.

16. A method of fabricating an acoustic filter, the method comprising:
    forming a plurality of series acoustic resonators coupled in series on a first resonator substrate;
    forming a plurality of shunt resonators on a second resonator substrate, wherein one of the first and second resonator substrates is quartz with a first cut angle, and the other of the first and second resonator substrates is quartz with a second cut angle;
    mounting the first and second resonator substrates on a support substrate; and
    electrically coupling each of the plurality of shunt resonators to a respective one of the plurality of series acoustic resonators.

17. The method of claim 16, wherein the plurality of series acoustic resonators are all surface acoustic wave resonators or all bulk acoustic wave resonators, and wherein the plurality of shunt resonators are all surface acoustic wave resonators or all bulk acoustic wave resonators.

18. The method of claim 16, wherein the first and second cut angles are each selected from the group consisting of: AT-cut, ST-cut, Y-cut, and rotated Y-cut.

19. The method of claim 16, wherein the electrically coupling comprises wire bonding a respective contact pad of each of the plurality of shunt resonators to a respective contact pad of the respective one of the plurality of series acoustic resonators.

20. The method of claim 19, wherein the mounting of the first and second resonator substrates further comprises placing the respective contact pad of each of the plurality of shunt resonators adjacent to a respective contact pad of the respective one of the plurality of series acoustic resonators.

21. A wireless communication device comprising:
    an antenna;
    an antenna duplexer coupled to an antenna;
    a mixer; and
    an input amplifier and an acoustic filter coupled between the antenna duplexer and the mixer, wherein the acoustic filter comprises a first resonator substrate comprising a plurality of series acoustic resonators, and a second resonator substrate comprising a plurality of shunt resonators, wherein one of the first and second resonator substrates is quartz with a first cut angle, and the other of the first and second resonator substrates is quartz with a second cut angle, and wherein each of the plurality of shunt resonators is electrically coupled to a respective one of the plurality of series acoustic resonators.

22. The wireless communication device of claim 21, wherein the plurality of series acoustic resonators are all surface acoustic wave resonators or all bulk acoustic wave resonators, and wherein the plurality of shunt resonators are all surface acoustic wave resonators or all bulk acoustic wave resonators.

23. The wireless communication device of claim 21, wherein the first and second cut angles are each selected from the group consisting of: AT-cut, ST-cut, Y-cut, and rotated Y-cut.

24. The wireless communication device of claim 21, wherein an input of the input amplifier is coupled to the antenna duplexer, wherein an output of the input amplifier is coupled to an input of the acoustic filter, and wherein an output of the acoustic filter is coupled to an input of the mixer.

25. The wireless communication device of claim 21, wherein an input of the acoustic filter is coupled to the antenna duplexer, wherein an output of the acoustic filter is coupled to an input of the input amplifier, and wherein an output of the input amplifier is coupled to an input of the mixer.

* * * * *